US010684637B2

(12) United States Patent
Yoshida

(10) Patent No.: US 10,684,637 B2
(45) Date of Patent: Jun. 16, 2020

(54) BANDGAP REFERENCE VOLTAGE GENERATING CIRCUIT WITH TEMPERATURE CORRECTION AT RANGE OF HIGH/LOW TEMPERATURE

(71) Applicant: NEW JAPAN RADIO CO., LTD., Chuo-ku, Tokyo (JP)

(72) Inventor: Haruhiko Yoshida, Fujimino (JP)

(73) Assignee: NEW JAPAN RADIO CO., LTD., Chuo-Ku, Tokyo (JP)

( * ) Notice: Subject to any disclaimer, the term of this patent is extended or adjusted under 35 U.S.C. 154(b) by 0 days.

(21) Appl. No.: 16/466,602

(22) PCT Filed: Dec. 19, 2017

(86) PCT No.: PCT/JP2017/045444
§ 371 (c)(1),
(2) Date: Jun. 4, 2019

(87) PCT Pub. No.: WO2018/135215
PCT Pub. Date: Jul. 26, 2018

(65) Prior Publication Data
US 2019/0317543 A1    Oct. 17, 2019

(30) Foreign Application Priority Data

Jan. 18, 2017 (JP) .................................. 2017-006326
May 31, 2017 (JP) .................................. 2017-107813

(51) Int. Cl.
*G05F 3/30* (2006.01)
*G05F 1/46* (2006.01)
*H01L 27/06* (2006.01)

(52) U.S. Cl.
CPC ............... *G05F 3/30* (2013.01); *G05F 1/463* (2013.01); *G05F 1/465* (2013.01); *G05F 1/468* (2013.01); *H01L 27/0635* (2013.01)

(58) Field of Classification Search
CPC . G05F 3/30; G05F 1/463; G05F 1/465; G05F 1/468; H01L 27/0635
See application file for complete search history.

(56) References Cited

U.S. PATENT DOCUMENTS 7,728,575 B1 * 6/2010 Ozalevli ................... G05F 3/30
323/313
2009/0058392 A1   3/2009 Yanagawa
(Continued)

FOREIGN PATENT DOCUMENTS

JP    2009-059149 A    3/2009
JP    2012-243054 A   12/2012
(Continued)

OTHER PUBLICATIONS

International Search Report and Written Opinion for related International Application No. PCT/JP2017/045444, dated Feb. 13, 2018; English translation of ISR provided; 10 pages.

*Primary Examiner* — Matthew V Nguyen
*Assistant Examiner* — Jye-June Lee
(74) *Attorney, Agent, or Firm* — Procopio, Cory, Hargreaves & Savitch LLP

(57) ABSTRACT a reference voltage generating circuit that includes a bandgap reference voltage generating circuit main body (10) configured to generate a substantially constant reference voltage at room temperature, a high temperature correction circuit (30) configured to increase a reference voltage generated by the reference voltage generating circuit main body at a high temperature by supplying a high temperature correction current that increases as the temperature increases to the resistor, a low temperature correction circuit (40) configured to increase a reference voltage generated by the reference voltage generating circuit main body at a low temperature by supplying a low temperature correction current that increases as the temperature decreases to the (Continued)

resistor, and a bias circuit (20) configured to generate a bias voltage according to the temperature, so as to control the high temperature correction current and the low temperature correction current at the same time.

8 Claims, 3 Drawing Sheets

(56) References Cited

U.S. PATENT DOCUMENTS

| | | | |
|---|---|---|---|
| 2013/0187628 A1* | 7/2013 | Furusawa | G05F 3/30 323/313 |
| 2013/0328615 A1* | 12/2013 | Sano | G05F 3/30 327/513 |
| 2015/0035588 A1 | 2/2015 | Sano et al. | |
| 2015/0177770 A1 | 6/2015 | Furusawa et al. | |
| 2016/0306377 A1 | 10/2016 | Sano et al. | |

FOREIGN PATENT DOCUMENTS

| | | |
|---|---|---|
| JP | 2013-149197 A | 8/2013 |
| JP | 2013-254359 A | 12/2013 |

\* cited by examiner

BANDGAP REFERENCE VOLTAGE GENERATING CIRCUIT WITH TEMPERATURE CORRECTION AT RANGE OF HIGH/LOW TEMPERATURE

TECHNICAL FIELD

The present invention relates to a bandgap reference voltage generating circuit that generates a reference voltage stable to temperature changes.

BACKGROUND ART

A reference voltage generating circuit 50 as shown in FIG. 4 is known as an example of a reference voltage generating circuit in the related art. The reference voltage generating circuit 50 is referred to as a bandgap reference voltage generating circuit, and includes: npn transistors Q1, Q2 whose bases are commonly connected to an output terminal 1; current-mirror-connected pnp transistors Q3, Q4 that are connected as active loads to collectors of the transistors Q1, Q2; a pnp transistor Q5 whose base is connected to the collector of the transistor Q1, collector is connected to the output terminal 1 and the bases of the transistors Q1, Q2, and the emitter of the transistor Q5 is connected to a power supply terminal; and resistors R1, R2 connected in series. The resistor R1 is connected between an emitter of the transistor Q1 and an emitter of the transistor Q2, and the resistor R2 is connected between the emitter of the transistor Q2 and the ground.

A reference voltage VBG output to the output terminal 1 is represented by the following formula when an area ratio of the transistors Q1, Q2 is Q1:Q2=n:1, an area ratio of the transistors Q3, Q4 is Q3:Q4=1:1, and a voltage between the base and the emitter of the transistor Q2 is Vbe2.

[Formula 1]

$$VBG = Vbe2 + 2 \times Vt \times \ln(n) \times \frac{R2}{R1} \quad (1)$$

Here, Vt is a thermal voltage (=kT/q, k: Boltzmann's constant, T: absolute temperature, q: electron charge), and has a positive temperature coefficient of substantially 0.0086 mV/° C. The voltage Vbe2 between the base and the emitter of the bipolar transistor Q2 has a negative temperature coefficient of substantially 2 mV.

Therefore, it is possible to generate the reference voltage VBG stable to temperature changes by using the two types of temperature coefficients to cancel each other out and setting values of n, R1, and R2.

However, a voltage Vbe between a base and an emitter of a bipolar transistor actually has a slight second-order temperature coefficient. Accordingly, as shown in FIG. 5, a temperature characteristic of the reference voltage VBG has a second-order temperature dependence that the reference voltage VBG decreases from a room temperature region A to a high temperature region B and a low temperature region C. For this reason, the slight temperature dependence may be a problem in an application such as an automotive application, in which stability is required for a wide temperature range.

Patent Document 1 has proposed a method of cancelling such a second-order temperature characteristic.

PRIOR ART LITERATURE

Patent Document

[Patent Document 1] JP-A-2009-59149

SUMMARY OF INVENTION

Technical Problems

However, the output voltage temperature characteristic described in Patent Document 1 may be not sufficient for use in industrial equipment and automotive applications.

An object of the present invention is to provide a reference voltage generating circuit capable of generating a reference voltage stable in a predetermined operating temperature range.

Solution to Problem (1) To achieve the above object, the present invention provides a reference voltage generating circuit that includes: a bandgap reference voltage generating circuit main body configured to generate a reference voltage at room temperature which is substantially constant and a reference voltage which is lower than the reference voltage at room temperature as temperature increases, by cancelling a negative temperature coefficient of a voltage between a base and an emitter of a transistor with a positive temperature coefficient of a resistor; a high temperature correction circuit configured to increase a reference voltage generated by the reference voltage generating circuit main body at a high temperature by supplying a high temperature correction current that increases as the temperature increases to the resistor; and a bias circuit configured to generate a bias voltage according to the temperature, so as to control the high temperature correction current by supplying the bias voltage to the high temperature correction circuit.

(2) According to the reference voltage generating circuit in (1), in the reference voltage generating circuit main body, a part of the resistor is formed by a series connection circuit of a first resistor, a second resistor, and a third resistor, and the high temperature correction current is supplied from the high temperature correction circuit to a common connection point of the first resistor and the second resistor.

(3) According to the reference voltage generating circuit in (2), the high temperature correction circuit includes a 10th transistor to which a bias voltage is supplied from the reference voltage generating circuit main body and a 11th transistor and a 12th transistor in which an output current of the 10th transistor branches and flows to emitters of the 11th transistor and the 12th transistor, a collector of the 11th transistor is connected to a ground, and a collector of the 12th transistor is connected to the common connection point of the first resistor and the second resistor in the reference voltage generating circuit main body. The bias circuit controls a collector current of the 11th transistor to be larger than a collector current of the 12th transistor at the room temperature, and controls the collector current of the 12th transistor to be larger than the collector current of the 11th transistor at the high temperature.

(4) According to the reference voltage generating circuit in (3), the bias circuit includes a sixth transistor and a seventh transistor to which a bias voltage is supplied from the reference voltage generating circuit main body, a fifth resistor, a sixth resistor, and a seventh resistor which are connected in series between a collector of the sixth transistor and the ground, and a diode-connected ninth transistor to which a collector current of the seventh transistor flows. A voltage at a common connection point of the sixth resistor and the seventh resistor is supplied to a base of the 11th transistor as a third bias voltage, and a collector voltage of the seventh transistor is supplied to a base of the 12th transistor as a fourth bias voltage.

(5) A second aspect of the present invention provides a reference voltage generating circuit that includes: a bandgap reference voltage generating circuit main body configured to generate, by cancelling a negative temperature coefficient of a voltage between a base and an emitter of a transistor with a positive temperature coefficient of a resistor, a reference voltage which is substantially constant at room temperature and a reference voltage which is lower than the reference voltage at room temperature as temperature decreases; a low temperature correction circuit configured to increase a reference voltage generated by the reference voltage generating circuit main body at a low temperature by supplying a low temperature correction current that increases as the temperature decreases to the resistor; and a bias circuit configured to generate a bias voltage according to the temperature, so as to control the low temperature correction current by supplying the bias voltage to the low temperature correction circuit.

(6) According to the reference voltage generating circuit in (5), in the reference voltage generating circuit main body, a part of the resistor is formed by a series connection circuit of a first resistor, a second resistor, and a third resistor, and the low temperature correction current is supplied from the low temperature correction circuit to a common connection point of the second and third resistors.

(7) According to the reference voltage generating circuit in (6), the low temperature correction circuit includes a 13th transistor to which a bias voltage is supplied from the reference voltage generating circuit main body and a 14th transistor and a 15th transistor in which an output current of the 13th transistor branches and flows to emitters of the 14th transistor and the 15th transistor, a collector of the 14th transistor is connected to a ground, and a collector of the 15th transistor is connected to the common connection point of the second and third resistors in the reference voltage generating circuit main body. The bias circuit controls a collector current of the 14th transistor to be larger than a collector current of the 15th transistor at the room temperature, and controls the collector current of the 15th transistor to be larger than the collector current of the 14th transistor at the low temperature.

(8) According to the reference voltage generating circuit in (7), the bias circuit includes a sixth transistor and a seventh transistor to which a bias voltage is supplied from the reference voltage generating circuit main body, a fifth resistor, a sixth resistor, and a seventh resistor which are connected in series between a collector of the sixth transistor and the ground, and a diode-connected ninth transistor to which a collector current of the seventh transistor flows. A collector voltage of the sixth transistor is supplied to a base of the 15th transistor as a first bias voltage, and a collector voltage of the seventh transistor is supplied to a base of the 14th transistor as a fourth bias voltage.

(9) A third aspect of the present invention provides a reference voltage generating circuit that includes: a bandgap reference voltage generating circuit main body configured to generate, by cancelling a negative temperature coefficient of a voltage between a base and an emitter of a transistor with a positive temperature coefficient of a resistor, a reference voltage which is substantially constant at room temperature and a reference voltage which is slightly lower than the reference voltage at room temperature as temperature increases and decreases; a high temperature correction circuit configured to increase a reference voltage generated by the reference voltage generating circuit main body at a high temperature by supplying a high temperature correction current that increases as the temperature increases to the resistor; a low temperature correction circuit configured to increase a reference voltage generated by the reference voltage generating circuit main body at a low temperature by supplying a low temperature correction current that increases as the temperature decreases to the resistor; and a bias circuit configured to generate a bias voltage according to the temperature, so as to control the high temperature correction current by supplying the bias voltage to the high temperature correction circuit, and to control the low temperature correction current by supplying the bias voltage to the low temperature correction circuit at the same time.

(10) According to the reference voltage generating circuit in (9), in the reference voltage generating circuit main body, a part of the resistor is formed by a series connection circuit of a first resistor, a second resistor, and a third resistor, the high temperature correction current is supplied from the high temperature correction circuit to a common connection point of the first resistor and the second resistor, and the low temperature correction current supplied from the low temperature correction circuit is supplied to a common connection point of the second and third resistors.

(11) According to the reference voltage generating circuit in (10), the high temperature correction circuit includes a 10th transistor to which a bias voltage is supplied from the reference voltage generating circuit main body and a 11th transistor and a 12th transistor in which an output current of the 10th transistor branches and flows to emitters of the 11th transistor and the 12th transistor, a collector of the 11th transistor is connected to a ground, and a collector of the 12th transistor is connected to the common connection point of the first resistor and the second resistor in the reference voltage generating circuit main body. The bias circuit controls a collector current of the 11th transistor to be larger than a collector current of the 12th transistor at the room temperature and the low temperature, and controls the collector current of the 12th transistor to be larger than the collector current of the 11th transistor at the high temperature. The low temperature correction circuit includes a 13th transistor to which a bias voltage is supplied from the reference voltage generating circuit main body and 14th and 15th transistors in which an output current of the 13th transistor branches and flows to emitters of the 14th transistor and the 15th transistor, a collector of the 14th transistor is connected to a ground, and a collector of the 15th transistor is connected to the common connection point of the second and third resistors in the reference voltage generating circuit main body. The bias circuit controls a collector current of the 14th transistor to be larger than a collector current of the 15th transistor at the room temperature and the high temperature, and controls the collector current of the 15th transistor to be larger than the collector current of the 14th transistor at the low temperature.

(12) According to the reference voltage generating circuit in (11), the bias circuit includes a sixth transistor and a seventh transistor to which a bias voltage is supplied from the reference voltage generating circuit main body, a fifth resistor, a sixth resistor, and a seventh resistor which are connected in series between a collector of the sixth transistor and the ground, and a diode-connected ninth transistor to which a collector current of the seventh transistor flows. A collector voltage of the sixth transistor is supplied to a base of the 15th transistor as a first bias voltage, and a voltage at a common connection point of the sixth resistor and the seventh resistor is supplied to a base of the 11th transistor as a third bias voltage, and a collector voltage of the seventh transistor is supplied to bases of the 12th transistor and the 14th transistor as a fourth bias voltage.

(13) In the reference voltage generating circuit according to (4), a diode-connected eighth transistor is connected in parallel to the sixth resistor and the seventh resistor.

(14) In the reference voltage generating circuit according to (12), a diode-connected eighth transistor is connected in parallel to the sixth resistor and the seventh resistor.

Advantageous Effects of Invention

According to the invention in (1) to (4), temperature correction of the reference voltage can be performed in the high temperature region. According to the invention in (5) to (8), temperature correction of the reference voltage can be performed in the low temperature region. According to the invention in (9) to (12), temperature correction of the reference voltage can be performed in both the low temperature region and the high temperature region. Therefore, a reference voltage characteristic can be flat in a desired temperature range, and accordingly an application region of an integrated circuit including the reference voltage generating circuit can be enlarged.

DESCRIPTION OF EMBODIMENTS

<Principle Configurations>

Figure 1:
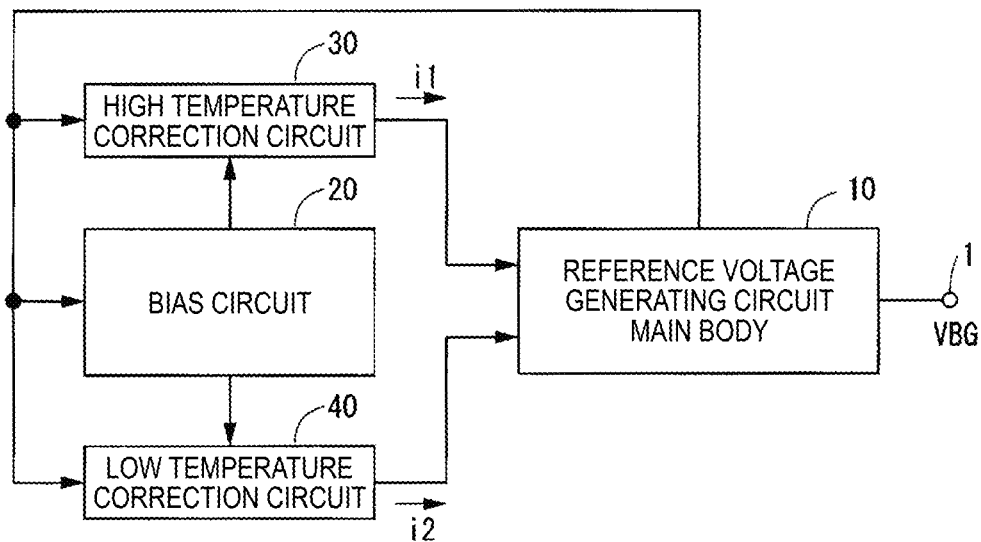
FIG. 1 is a block diagram of principle configurations of a reference voltage generating circuit of the present invention.
Figure 4:
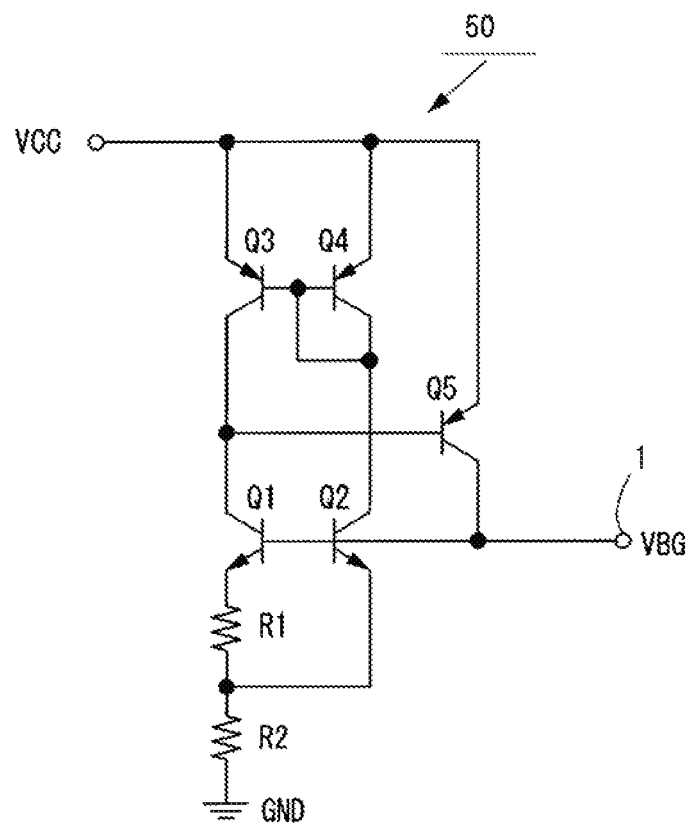
FIG. 4 is a circuit diagram of a specific circuit of a reference voltage generating circuit in the related art.
Figure 5:
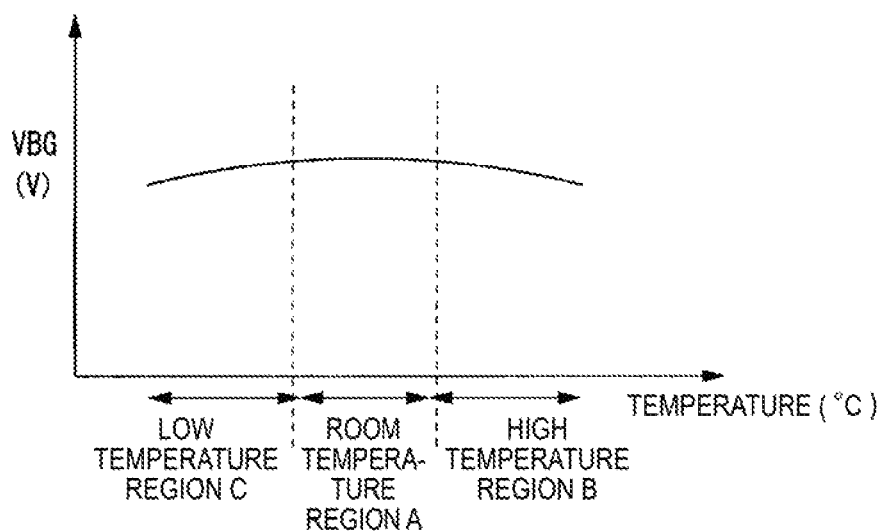
FIG. 5 is a temperature characteristic diagram of a reference voltage generated by the reference voltage generating circuit in FIG. 4.

FIG. 1 shows principle configurations of a reference voltage generating circuit of the present invention. 10 is a bandgap reference voltage generating circuit main body equivalent to that in FIG. 4, 20 is a bias circuit that generates a bias voltage having a temperature characteristic, 30 is a high temperature correction circuit, and 40 is a low temperature correction circuit.

Figure 2:
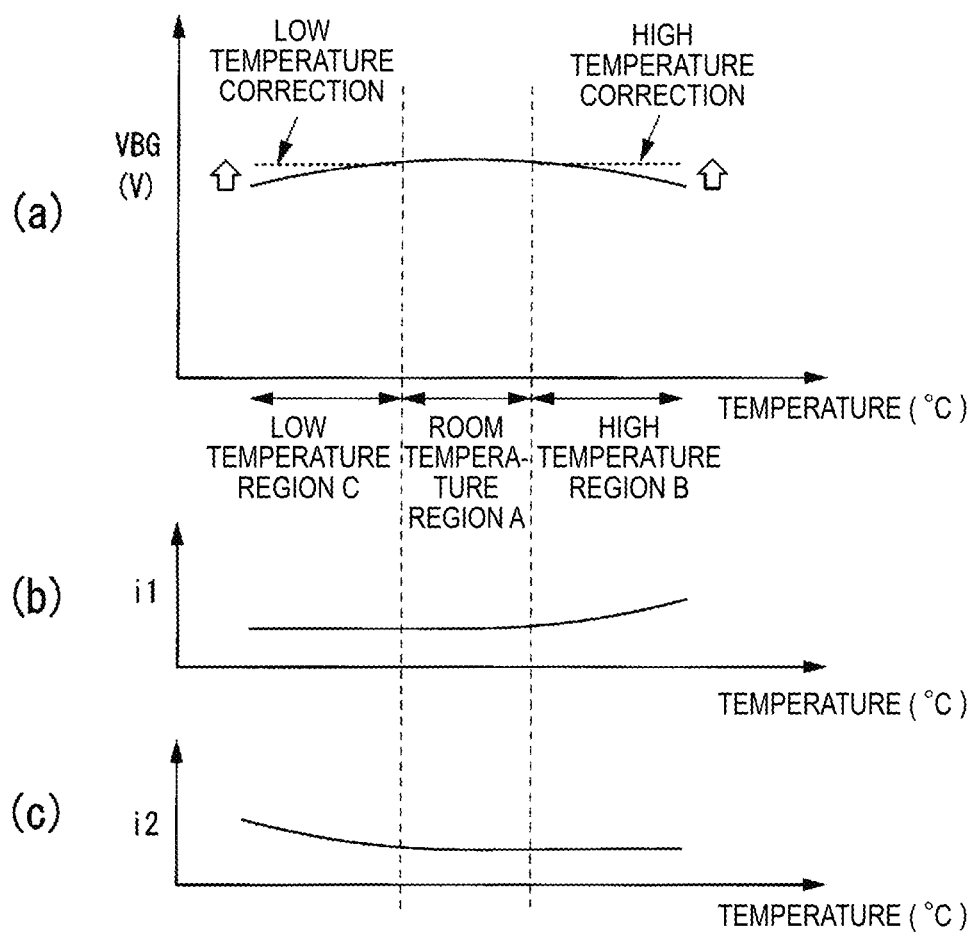
FIG. 2(a) is a tempesrated by a reference voltage generating circuit main body.
FIG. 2(b) is a temperature characteristic diagram of a correction current i1 generated by a high temperature correction circuit.
FIG. 2(c) is a temperature characteristic diagram of a correction current i2 generated by a low temperature correction circuit.

In the present invention, as shown in FIG. 2(a), an operating temperature range of a reference voltage generated by the reference voltage generating circuit main body 10 is divided into three regions of a room temperature region A, a high temperature region B, and a low temperature region C. The room temperature region A is approximately 0 to 100° C., the high temperature region B is approximately 100 to 150° C., and the low temperature region C is approximately −50 to 0° C. The high temperature correction circuit 30 generates the current i1 (FIG. 2(b)) which increases and corrects the reference voltage VBG voltage in the high temperature region B only by a high temperature bias voltage generated by the bias circuit 20 at a high temperature (100 to 150° C.), and outputs the current i1 to the reference voltage generating circuit main body 10. The low temperature correction circuit 40 generates the current i2 (FIG. 2(c)) which increases and corrects the reference voltage VBG in the low temperature region C only by a low temperature bias voltage generated by the bias circuit 20 at a low temperature (−50 to 0° C.), and outputs the current i2 to the reference voltage generating circuit main body 10. Accordingly, the reference voltage VBG generated by the reference voltage generating circuit main body 10 can serve as a flat stable voltage over an entire temperature range, as indicated by a dotted line in FIG. 2(a).

First Embodiment

Figure 3:
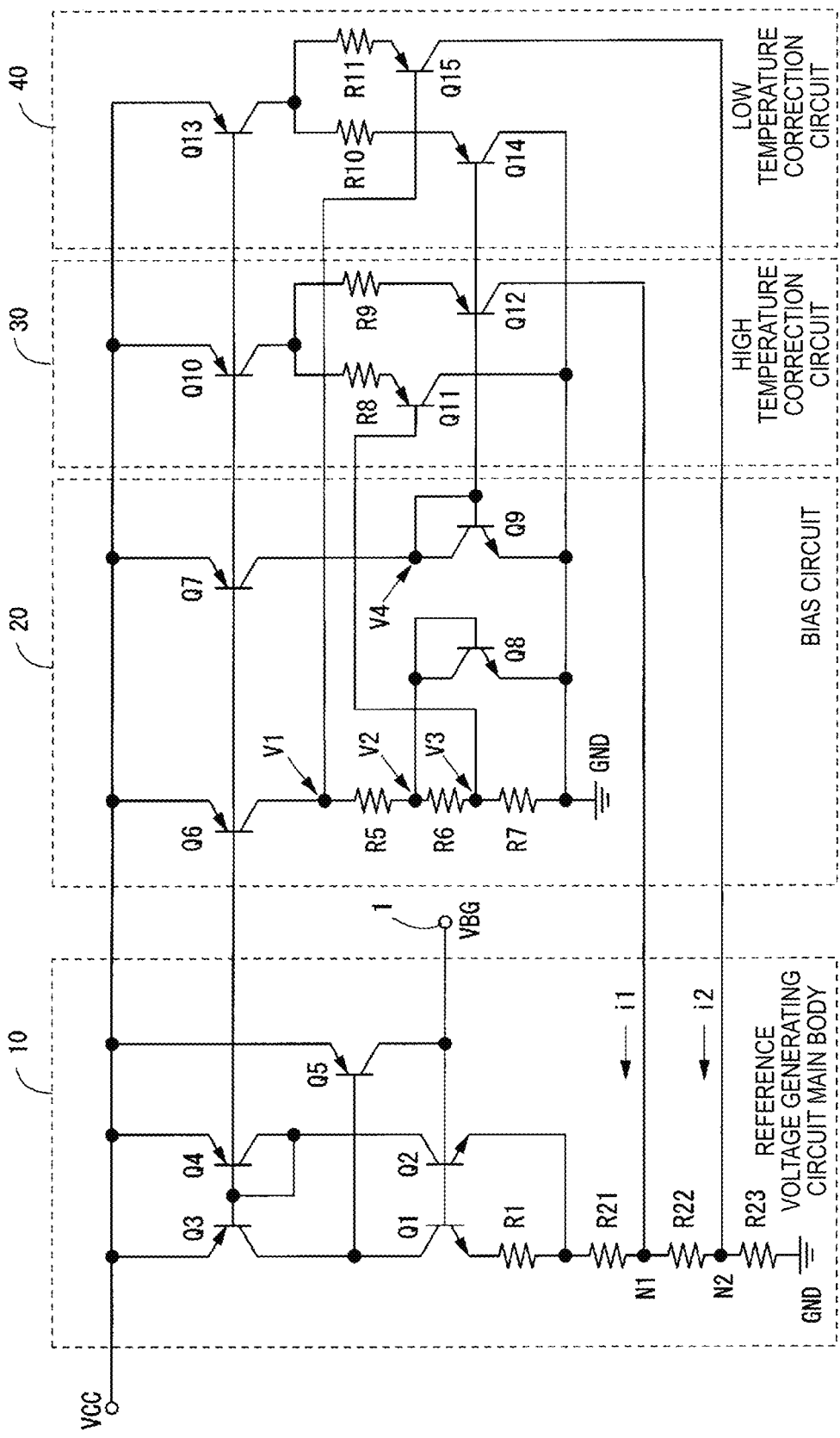
FIG. 3 is a circuit diagram of a specific circuit of a reference voltage generating circuit according to a first embodiment of the present invention.

FIG. 3 shows a reference voltage generating circuit according to a first embodiment of the present invention. The reference voltage generating circuit main body 10 includes three resistors R21, R22, R23 that constitute the resistor R2 having a configuration in the reference voltage generating circuit 50 in FIG. 4. That is, resistance values of the resistors R21, R22, R23 are of a relationship of R21+R22+R23=R2.

The bias circuit 20 includes pnp transistors Q6, Q7 whose bases are commonly connected to the transistors Q3, Q4, resistors R5, R6, R7 connected in series between a collector of the transistor Q6 and a ground GND, a diode-connected npn transistor Q8 connected between a common connection point of the resistors R5, R6 and the ground GND, and an npn transistor Q9 diode-connected to a collector of the transistor Q7.

The high temperature correction circuit 30 includes: a pnp transistor Q10 whose base is commonly connected the transistors Q3, Q4; resistors R8, R9 that each have one end connected to a collector of the transistor Q10; a pnp transistor Q11 whose emitter is connected to another end of the resistor R8, base is connected to a common connection point of the resistors R6, R7, and collector is connected to the ground GND; and a pnp transistor Q12 whose emitter is connected to another end of the resistor R9, base is connected to a base of the transistor Q9, and collector is connected to a common connection node N1 of the resistors R21, R22.

The low temperature correction circuit 40 includes: a pnp transistor Q13 whose base is commonly connected the transistors Q3, Q4; resistors R10, R11 that each have one end connected to a collector of the transistor Q13; a pnp transistor Q14 whose emitter is connected to another end of the resistor R10, base is connected to the base of the transistor Q9, and collector is connected to the ground GND; and a pnp transistor Q15 whose emitter is connected to another end of the resistor R11, base is connected to the collector of the transistor Q6, and collector is connected to a common connection node N2 of the resistors R22, R23.

The reference voltage VBG generated by the reference voltage generating circuit in this embodiment is represented by

[Formula 2]

$$VBG = Vbe2 + 2 \times Vt \times \ln(n) \times \frac{(R21 + R22 + R23)}{R1} \quad (2)$$

in the room temperature region A,

[Formula 3]

$$VBG = Vbe2 + 2 \times Vt \times \ln(n) \times \frac{(R21 + R22 + R23)}{R1} + i1 \times (R22 + R23) \quad (3)$$

in the high temperature region B, and

[Formula 4]

$$VBG = Vbe2 + 2 \times Vt \times \ln(n) \times \frac{(R21 + R22 + R23)}{R1} + i2 \times R23 \quad (4)$$

in the low temperature region C. In this manner, the reference voltage VBG is corrected to be higher in the high temperature region B than in the room temperature region A by a voltage of i1×(R22+R23), and is corrected to be higher in the low temperature region C than in the room temperature region A by a voltage of i2×R23.

This is described in detail below. Here, as bias voltages generated in the bias circuit 20, when a collector voltage of the transistor Q6 is V1, a voltage at the common connection point of the resistors R5, R6 is V2, a voltage at the common connection point of the resistors R6, R7 is V3, and a collector voltage of the resistor Q7 is V4, resistances of resistors R5 to R7 and characteristics of transistors Q5 to Q9 are set so that the bias voltages V1, V2, V3, V4 are of the following relationships:

| | |
|---|---|
| $V1>V2>V4>V3$ | room temperature region A: |
| $V1>V2>V3>V4$ | high temperature region B: |
| $V4>V1>V2>V3$. | low temperature region C: |

First, the bias voltages are V1>V2>V4>V3 in the room temperature region A as described above. Accordingly, in the high temperature correction circuit 30, a collector current of the transistor Q11 is larger than that of the transistor Q12 by V4>V3, most of a collector current of the transistor Q10 flows to the transistor Q11, and the collector current i1 of the transistor Q12 is almost zero. In the low temperature correction circuit 40, a collector current of the transistor Q14 is larger than that of the transistor Q15 by V1>V4, most of a collector current of the transistor Q13 flows through the transistor Q14, and the collector current i2 of the transistor Q15 is almost zero. Therefore, a voltage increase due to correction does not occur in the resistors R22, R23, and the generated reference voltage VBG is represented by Formula (2).

Next, the bias voltages are V1>V2>V3>V4 in the high temperature region B as described above. Therefore, in the high temperature correction circuit 30, the collector current of the transistor Q12 is larger than that of the transistor Q11 by V3>V4, most of the collector current of the transistor Q10 flows to the transistor Q12, and the collector current i1 increases as temperature increases from the transistor Q12. In the low temperature correction circuit 40, the collector current of the transistor Q14 is larger than that of the transistor Q15 by V1>V4, most of the collector current of the transistor Q13 flows through the transistor Q14, and the collector current i2 of the transistor Q15 is almost zero. Therefore, the current i1 flows through the resistors R22, R23, and accordingly the reference voltage VBG is corrected to be higher by a voltage generated at the resistors R22, R23 by "i1×(R22+R23)", as shown in Formula (3).

Next, the bias voltages are V4>V1>V2>V3 in the low temperature region C as described above. Therefore, in the high temperature correction circuit 30, the collector current of the transistor Q11 is larger than that of the transistor Q12 by V4>V3, most of the collector current of the transistor Q10 flows to the transistor Q11, and the collector current i1 of the transistor Q12 is almost zero. In the low temperature correction circuit 40, the collector current of the transistor Q15 is larger than that of the transistor Q14 by V4>V1, most of the collector current of the transistor Q13 flows to the transistor Q15, and the collector current i2 increases as temperature decreases from the transistor Q15. Therefore, the current i2 flows through the resistor R23, and accordingly the reference voltage VBG is corrected to be higher by a voltage generated at the resistor R23 by "i1×R23", as shown in Formula (4).

In the high temperature region B, a threshold voltage of the transistor Q8 is smaller than that in the room temperature region A or the low temperature region C. Accordingly, an internal resistance of the transistor Q8 decreases and a current flowing to the resistors R6, R7 is shunted to the transistor Q8. Therefore, the bias voltages V1 to V3 are lower than those when the transistor Q8 is not present, and a current flowing through the transistor Q11 is slightly increased, so that an excessive current is prevented from flowing to the transistor Q12. Since the threshold voltage of the transistor Q8 increases in the room temperature region A and the low temperature region C, influences of the transistor Q8 is eliminated.

From the above, the reference voltage VBG output from the reference voltage generating circuit main body 10 is corrected and increased by the high temperature correction circuit 30 when the temperature is in the high temperature region B, and is corrected and increased by the low temperature correction circuit 40 when the temperature is in the low temperature region C. Accordingly, a substantially flat temperature characteristic of the reference voltage VBG can be realized over the entire temperature range from a low temperature to a high temperature, as shown by the dotted line in FIG. 2(*a*).

Second Embodiment

In a reference voltage generating circuit in FIG. 3, temperature correction is performed for the high temperature region B and the low temperature region C. However, the temperature correction for the high temperature region B only may be sufficient depending on applications. The low temperature correction circuit 40 is not used when only the high temperature region B is subjected to the temperature correction. The bias voltage V1 supplied to the low temperature correction circuit 40 is also not necessary. In this case, the resistors R22, R23 can be replaced with one resistor (resistance value=R22+R23) in the reference voltage generating circuit main body 10.

Third Embodiment

In a reference voltage generating circuit in FIG. 3, temperature correction is performed for the high temperature region B and the low temperature region C. However, the temperature correction for the low temperature region C only may be sufficient depending on applications. The high temperature correction circuit 30 is not used when only the low temperature region C is subjected to the temperature correction. Further, neither the bias voltage V1 supplied to the high temperature correction circuit 30 nor the transistor Q8 in the bias circuit 20 is necessary. In this case, the resistors R21, R22 can be replaced with one resistor (resistance value=R21+R22) in the reference voltage generating circuit main body 10, and the resistors R6, R7 can be replaced with one resistor (resistance value=R6+R7) in the bias circuit 20.

Although the present invention has been described in detail with reference to specific embodiments, it is apparent to those skilled in the art that various changes and modifications can be made without departing from the spirit and scope of the present invention.

This application is based on Japanese Patent Application (JP-A-2017-006326) filed on Jan. 18, 2017 and Japanese Patent Application (JP-A-2017-107813) filed on May 31, 2017, contents of which are incorporated herein by reference.

REFERENCE SIGNS LIST

10: reference voltage generating circuit main body
20: bias circuit
30: high temperature correction circuit
40: low temperature correction circuit
50: reference voltage generating circuit in related art

The invention claimed is:

1. A reference voltage generating circuit comprising:
a bandgap reference voltage generating main body configured to generate a first reference voltage which is substantially constant at a first range of temperature by cancelling a negative temperature coefficient of a voltage between a base and an emitter of a transistor with a positive temperature coefficient of a resistor;
a high temperature correction circuit configured to supply a high temperature correction current to the resistor, the high temperature correction current increasing as temperature increases to a second range of temperature that is higher than the first range of temperature; and
a bias circuit configured to generate a bias voltage according to temperature, so as to control the high temperature correction current by supplying the bias voltage to the high temperature correction circuit,
wherein the high temperature correction circuit is configured to increase a second reference voltage at the second range of temperature,
wherein, in the bandgap reference voltage generating main body, a part of the resistor is formed by a series connection circuit of a first resistor, a second resistor, a third resistor, and a fourth resistor,
wherein the high temperature correction current is supplied from the high temperature correction circuit to a common connection point of the first resistor and the second resistor,
wherein the high temperature correction circuit includes a 10th transistor to which a bias voltage is supplied from the bandgap reference voltage generating main body and a 11th transistor and a 12th transistor in which an output current of the 10th transistor branches and flows to emitters of the 11th transistor and the 12th transistor, a collector of the 11th transistor is connected to a ground, and a collector of the 12th transistor is connected to the common connection point of the first resistor and the second resistor in the bandgap reference voltage generating main body, and
wherein the bias circuit controls a collector current of the 11th transistor to be larger than a collector current of the 12th transistor at the first range of temperature, and controls the collector current of the 12th transistor to be larger than the collector current of the 11th transistor at the second range of temperature.

2. The reference voltage generating circuit according to claim 1,
wherein the bias circuit includes a sixth transistor and a seventh transistor to which a bias voltage is supplied from the bandgap reference voltage generating main body, a fifth resistor, a sixth resistor, and a seventh resistor which are connected in series between a collector of the sixth transistor and the ground, and a diode-connected ninth transistor to which a collector current of the seventh transistor flows,
wherein a voltage at a common connection point of the sixth resistor and the seventh resistor is supplied to a base of the 11th transistor as a third bias voltage, and
wherein a collector voltage of the seventh transistor is supplied to a base of the 12th transistor as a fourth bias voltage.

3. The reference voltage generating circuit according to claim 2,
wherein a diode-connected eighth transistor is connected in parallel to the sixth resistor and the seventh resistor.

4. A reference voltage generating circuit comprising:
a bandgap reference voltage generating main body configured to generate a first reference voltage which is substantially constant at a first range of temperature by cancelling a negative temperature coefficient of a voltage between a base and an emitter of a transistor with a positive temperature coefficient of a resistor;
a low temperature correction circuit configured to supply a low temperature correction current to the resistor, the low temperature correction current increasing as temperature decreases to a third range of temperature that is lower than the first range of temperature; and
a bias circuit configured to generate a bias voltage according to temperature, so as to control the low temperature correction current by supplying the bias voltage to the low temperature correction circuit,
wherein the low temperature correction circuit is configured to increase a third reference voltage at the third range of temperature,
wherein, in the bandgap reference voltage generating main body, a part of the resistor is formed by a series connection circuit of a first resistor, a second resistor, a third resistor, and a fourth resistor,
wherein the low temperature correction current is supplied from the low temperature correction circuit to a common connection point of the second resistor and the third resistor,
wherein the low temperature correction circuit includes a 13th transistor to which a bias voltage is supplied from the bandgap reference voltage generating main body and a 14th transistor and a 15th transistor in which an output current of the 13th transistor branches and flows to emitters of the 14th transistor and the 15th transistor, a collector of the 14th transistor is connected to a ground, and a collector of the 15th transistor is connected to the common connection point of the second resistor and the third resistor in the bandgap reference voltage generating main body, and
wherein the bias circuit controls a collector current of the 14th transistor to be larger than a collector current of the 15th transistor at the first range of temperature, and controls the collector current of the 15th transistor to be larger than the collector current of the 14th transistor at the third range of temperature.

5. The reference voltage generating circuit according to claim 4,
- wherein the bias circuit includes a sixth transistor and a seventh transistor to which a bias voltage is supplied from the bandgap reference voltage generating main body, a fifth resistor, a sixth resistor, and a seventh resistor which are connected in series between a collector of the sixth transistor and the ground, and a diode-connected ninth transistor to which a collector current of the seventh transistor flows,
- wherein a collector voltage of the sixth transistor is supplied to a base of the 15th transistor as a first bias voltage, and
- wherein a collector voltage of the seventh transistor is supplied to a base of the 14th transistor as a fourth bias voltage.

6. A reference voltage generating circuit comprising:
- a bandgap reference voltage generating main body configured to generate a first reference voltage which is substantially constant at a first range of temperature by cancelling a negative temperature coefficient of a voltage between a base and an emitter of a transistor with a positive temperature coefficient of a resistor;
- a high temperature correction circuit configured to supply a high temperature correction current to the resistor, the high temperature correction current increasing as temperature increases to a second range of temperature that is higher than the first range of temperature;
- a low temperature correction circuit configured to supply a low temperature correction current to the resistor, the low temperature correction circuit increasing as temperature decreases to a third range of temperature that is lower than the first range of temperature; and
- a bias circuit configured to generate a bias voltage according to temperature, so as to control the high temperature correction current by supplying the bias voltage to the high temperature correction circuit, and to control the low temperature correction current by supplying the bias voltage to the low temperature correction circuit at a same time,
- wherein the high temperature correction circuit is configured to increase a second reference voltage at the second range of temperature,
- wherein the low temperature correction circuit is configured to increase a third reference voltage at the third range of temperature,
- wherein, in the bandgap reference voltage generating main body, a part of the resistor is formed by a series connection circuit of a first resistor, a second resistor, a third resistor, and a fourth resistor,
- wherein the high temperature correction current is supplied from the high temperature correction circuit to a first common connection point of the first resistor and the second resistor, and the low temperature correction current supplied from the low temperature correction circuit is supplied to a second common connection point of the second resistor and the third resistor,
- wherein the first common connection point and the second common connection point are different points,
- wherein the high temperature correction circuit includes a 10th transistor to which a bias voltage is supplied from the bandgap reference voltage generating main body and a 11th transistor and a 12th transistor in which an output current of the 10th transistor branches and flows to emitters of the 11th transistor and the 12th transistor, a collector of the 11th transistor is connected to a ground, and a collector of the 12th transistor is connected to the common connection point of the first resistor and the second resistor in the bandgap reference voltage generating main body,
- wherein the bias circuit controls a collector current of the 11th transistor to be larger than a collector current of the 12th transistor at the first range of temperature and the third range of temperature, and controls the collector current of the 12th transistor to be larger than the collector current of the 11th transistor at the second range of temperature,
- wherein the low temperature correction circuit includes a 13th transistor to which a bias voltage is supplied from the bandgap reference voltage generating main body and a 14th transistor and a 15th transistor in which an output current of the 13th transistor branches and flows to emitters of the 14th transistor and the 15th transistor, a collector of the 14th transistor is connected to a ground, and a collector of the 15th transistor is connected to the common connection point of the second and third resistors in the bandgap reference voltage generating main body, and
- wherein the bias circuit controls a collector current of the 14th transistor to be larger than a collector current of the 15th transistor at the first range of temperature and the second range of temperature, and controls the collector current of the 15th transistor to be larger than the collector current of the 14th transistor at the third range of temperature.

7. The reference voltage generating circuit according to claim 6,
- wherein the bias circuit includes a sixth transistor and a seventh transistor to which a bias voltage is supplied from the bandgap reference voltage generating main body, a fifth resistor, a sixth resistor, and a seventh resistor which are connected in series between a collector of the sixth transistor and the ground, and a diode-connected ninth transistor to which a collector current of the seventh transistor flows,
- wherein a collector voltage of the sixth transistor is supplied to a base of the 15th transistor as a first bias voltage, and
- wherein a voltage at a common connection point of the sixth resistor and the seventh resistor is supplied to a base of the 11th transistor as a third bias voltage, and
- wherein a collector voltage of the seventh transistor is supplied to bases of the 12th transistor and the 14th transistor as a fourth bias voltage.

8. The reference voltage generating circuit according to claim 7,
- wherein a diode-connected eighth transistor is connected in parallel to the sixth resistor and the seventh resistor.

* * * * *